United States Patent [19]
Cockrum et al.

[11] Patent Number: 5,880,510
[45] Date of Patent: Mar. 9, 1999

[54] GRADED LAYER PASSIVATION OF GROUP II-VI INFRARED PHOTODETECTORS

[75] Inventors: Charles A. Cockrum, Goleta; David R. Rhiger; Eric F. Schulte, both of Santa Barbara, all of Calif.

[73] Assignee: Raytheon Company, Lexington, Mass.

[21] Appl. No.: 193,029

[22] Filed: May 11, 1988

[51] Int. Cl.$^6$ .................................................. H01L 31/00
[52] U.S. Cl. ........................... 257/442; 257/444; 257/448
[58] Field of Search ........................ 357/24 LR; 257/442, 257/444, 448

[56] References Cited

U.S. PATENT DOCUMENTS

| | | | |
|---|---|---|---|
| 3,845,494 | 10/1974 | Ameurlaine et al. | 257/442 |
| 3,988,774 | 10/1976 | Cohen-Solal et al. | 204/172.5 |
| 4,132,999 | 1/1979 | Maille et al. | 257/188 |
| 4,137,625 | 2/1979 | White | 357/24 X |
| 4,196,508 | 4/1980 | Lorenze, Jr. | 357/24 LR |
| 4,197,553 | 4/1980 | Finnila et al. | 357/24 LR |
| 4,206,470 | 6/1980 | White | 357/24 LR |
| 4,275,407 | 6/1981 | Lorenze, Jr. | 357/24 LR |
| 4,286,278 | 8/1981 | Lorenze, Jr. | 357/24 LR |
| 4,639,756 | 1/1987 | Rosbeck et al. | 257/442 |

OTHER PUBLICATIONS

U.S. Patent Application No.: 07/088,330 filed Aug. 24, 1987 K. Kosai.
U.S. Patent Application No.: 07/123,403 filed Nov. 20, 1987 P. Norton.
"Epitaxial Passivation of Group II–VI Infrared Photodetectors" Cockrum et al, (Attorney Docket No. PD–S87020) S.N. 07/174,745 filed Mar. 29, 1988.
"Buried Junction Infrared Photodetectors", Cockrum et al (Attorney Docket PD–S87024) Filed Apr. 7, 1988.

*Primary Examiner*—Peter A. Nelson
*Attorney, Agent, or Firm*—W. C. Schubert; G. H. Lenzen, Jr.

[57] ABSTRACT

A Group II-VI IR photodiode 10 has a passivation layer 16 overlying at least exposed surfaces of the p-n diode junction 15, the passivation layer being a compositionally graded layer comprised of Group II atoms diffused into a surface of the p-n diode junction. The passivation layer has a wider energy bandgap than the underlying diode material thereby repelling both holes and electrons away from the surface of the diode and resulting in improved diode operating characteristics. A cation substitution method of the invention includes the steps of preparing a surface to be passivated, such as by depleting an upper surface region of Group II atoms; depositing a layer comprised of a Group II material over the depleted surface region; and annealing the deposited layer and underlying Group II-VI material such that atoms of the deposited Group II layer diffuse into the underlying depleted surface region and fill cation vacancy sites within the depleted surface region. The resulting passivation layer is a compositionally graded layer having an energy bandgap which gradually decreases in value as a function of depth from the surface until the bandgap energy equals that of the underlying bulk material. The preparation of the surface may also be accomplished by providing a body of Group II-VI material which has a substantially stoichiometric composition.

44 Claims, 7 Drawing Sheets

INCIDENT
INFRARED RADIATION

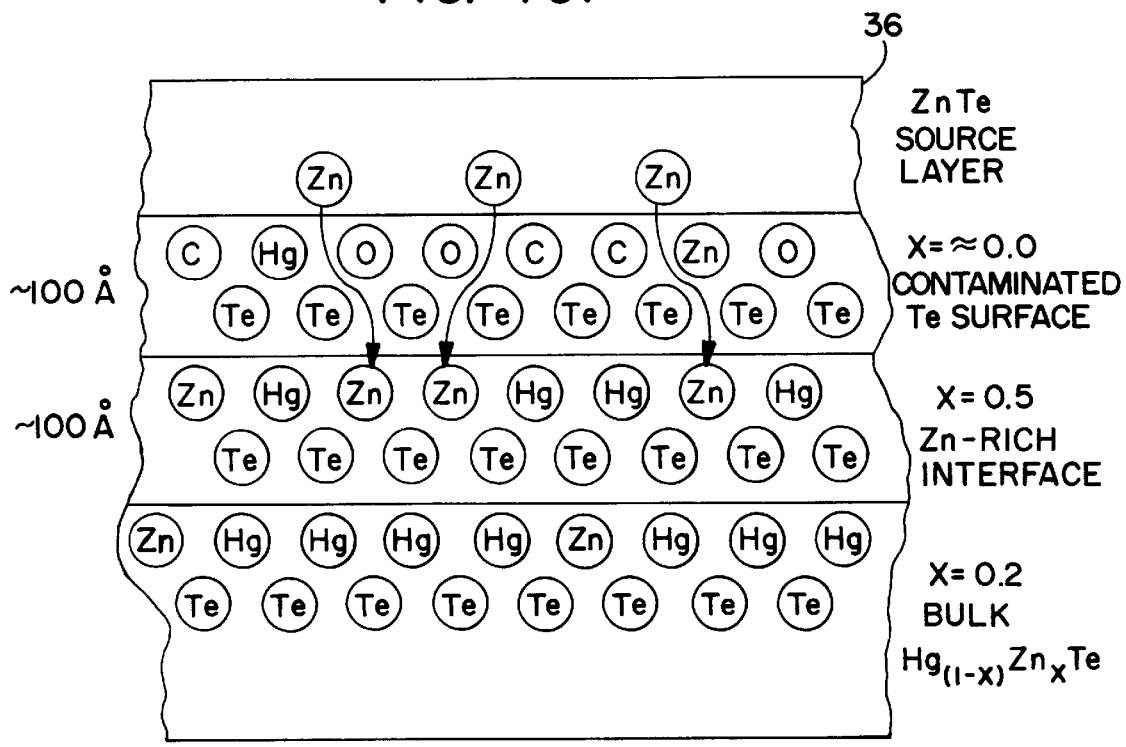
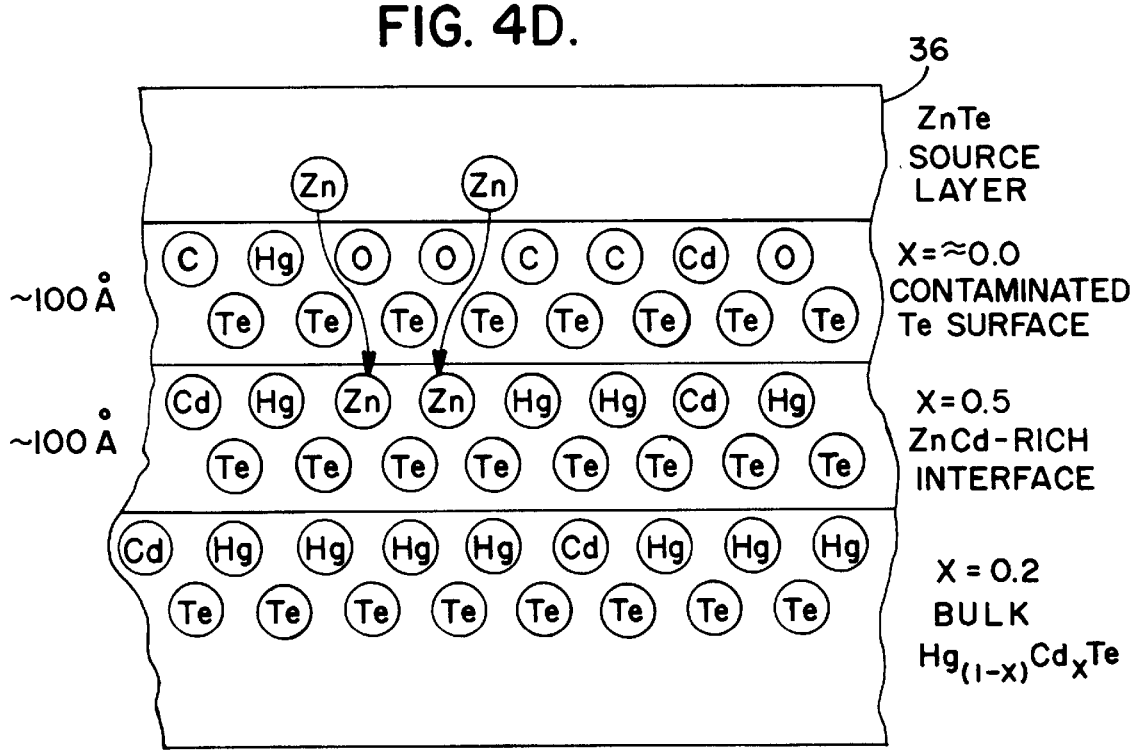

TYPICAL IV CURVES   AVG. $R_oA = 18\ \Omega\text{-cm}^2$
AVG. $R_{-50mv}A = 248\ \Omega\text{-cm}^2$
CUTOFF WAVELENGTH = 11. $\mu$m $SiO_2$
TYPICAL IV CURVES   AVG. $R_oA = 0.6\ \Omega\text{-cm}^2$
CUTOFF WAVELENGTH = 11. $\mu$m

GRADED LAYER PASSIVATION OF GROUP II-VI INFRARED PHOTODETECTORS

FIELD OF THE INVENTION

This invention relates generally to Group II-VI semiconductor devices and, in particular, to a HgCdTe IR photodetector which has a wider bandgap, graded composition Group II-VI passivation layer which is formed by a cation substitution process.

BACKGROUND OF THE INVENTION

Mercury—cadmium—telluride ($Hg_{(1-x)}Cd_xTe$, where x ranges from approximately zero to 1.0 and has typical values ranging from 0.2 to 0.4) photodiodes are typically fabricated as two dimensional arrays and include a layer of passivation applied to an upper surface of the array, the passivation layer comprising low-temperature photochemical $SiO_2$, evaporated ZnS, or anodically grown CdS. While suitable for some imaging applications it has been found that during certain subsequent processing steps which involve the array, such as a 100° C., high vacuum bake cycle required to outgas a vacuum Dewar which houses the photodiode array, that such a conventional passivation layer may be disadvantageous. For example, there has been observed a degradation in critical performance parameters such as leakage current, quantum efficiency, noise (especially at low frequencies), spectral response, and optical area. This degradation is especially evident in long-wavelength detectors where changes in surface potential approaches the bandgap energy. Porosity of the passivation layer and lack of adhesion to the underlying HgCdTe surface are also common problems observed with the aforedescribed conventional passivation layers.

Furthermore, inasmuch as these conventional passivation materials form no more than a coating upon the HgCdTe surface, control over the energy levels at the HgCdTe/passivation interface is difficult or impossible to achieve. A limitation of such conventional coatings is that it is necessary to both create and maintain flatband conditions at the HgCdTe/passivation interface if the array is to maintain a desired level of performance parameters, especially during and after high temperature processing and storage.

SUMMARY OF THE INVENTION

The foregoing problems are overcome and other advantages are realized by an IR photodiode and an array of same constructed in accordance with the invention. In accordance with one method of the invention there is disclosed the formation of a passivation region upon a semiconductor device which comprises the steps of providing a body comprised of Group II-VI material having a characteristic bandgap energy or energies; preparing a surface region of the body; forming a layer comprised of Group II atoms overlying the prepared surface of the body; and forming a passivation region within the prepared surface region wherein the Group II atoms occupy cation sites in gradually decreasing concentration as a function of depth into the surface region. The surface may be prepared by a surface etching process which depletes the surface region of Group II atoms, resulting in cation vacancy sites which have a gradually decreasing concentration as a function of depth within the surface region. As a result, the Group II atoms which occupy these cation sites also have a gradually decreasing concentration as a function of depth.

In accordance with the invention the step of providing a body of Group II-VI material may be accomplished by providing a body of $Hg_{(1-x)}Cd_xTe$, $Hg_{(1-x)}Zn_xTe$ or HgCdZnTe and the step of forming a layer may be accomplished by forming a layer comprised of Cd, Zn, CdTe, ZnTe, or of HgCdTe or HgZnTe having a wider bandgap energy than the characteristic bandgap energy or energies of the body.

The passivation region may be formed by annealing the body and overlying layer in a saturated Hg atmosphere.

BRIEF DESCRIPTION OF THE DRAWING

These and other aspects of the invention will be made more apparent in the following Detailed Description of Preferred Embodiments read in conjunction with the accompanying Drawing wherein;

FIGS. 4a–4d are representative cross-sectional views of a depleted surface of a HgCdTe layer showing the cation substitution of Group II atoms within the depleted surface;

DETAILED DESCRIPTION OF PREFERRED EMBODIMENTS

Although the invention will be described in the context of a backside illuminated photovoltaic mesa-type radiation detector it should be realized that the teachings of the invention also apply to photoconductive and to frontside illuminated radiation detectors. The invention also applies to homojunction and heterojunction type devices and also to planar-type devices wherein a base layer of a given type of conductivity has regions, or "wells", of an opposite type of conductivity formed in an upper surface thereof. As will become apparent, the invention also encompasses the surface passivation of devices other than photodiodes, such as other bipolar devices, and also CCD and MIS devices which comprise a region of bulk Group II-VI semiconductor material.

Figure 1A:
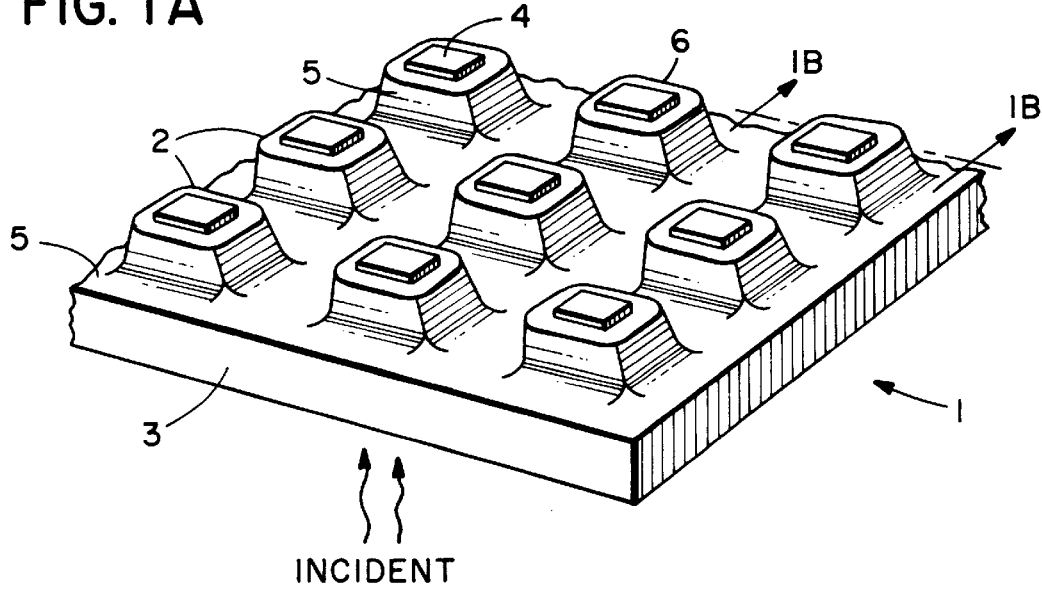
FIG. 1a is a stylized perspective view, not to scale, of a portion of an array 1 of Group II-VI photodiodes 2 having, in accordance with the invention, a graded composition passivation layer 5 which is comprised of Group II-VI material.

Referring first to FIG. 1a there is shown a stylized, top perspective view of a portion of an array 1 of photodiodes 2, the view not being to scale. The photodiodes are comprised of a Group II-VI material, such as $Hg_{(1-x)}Cd_xTe$, $Hg_{(1-x)}Zn_xTe$ or HgCdZnTe. The material is differentiated into material having a first conductivity type and a material having a second conductivity type to form a plurality of diode junctions. Array 1 can be seen to be comprised of a plurality of photodiodes 2 which are disposed in a regular, two dimensional array. Incident IR radiation, which may be long wavelength, medium wavelength or short wavelength (LWIR, MWIR or SWIR) radiation, is incident upon a surface of the array 1. The array 1, in an illustrative embodiment of the invention comprises a radiation absorbing base layer 3 of $Hg_{(1-x)}Cd_xTe$ semiconductor material, the value of x determining the responsivity of the array to either LWIR, MWIR or SWIR. Each of the photodiodes 2 is defined by a mesa structure 6, the mesas typically being formed by etching intersecting V-shaped grooves into the base layer through an overlying cap layer which has an opposite type of conductivity from the base layer. Each of the photodiodes 2 is provided with an area of contact metallization 4 upon a top surface thereof, the metallization serving to electrically couple an underlying photodiode to a readout device (not shown) typically via an indium bump (not shown). The upper surface of the array 1 is also provided with, in accordance with the invention, a passivation layer 5 comprised of a layer of Group II-VI material which is compositionally graded as a function of depth.

Figure 1B:
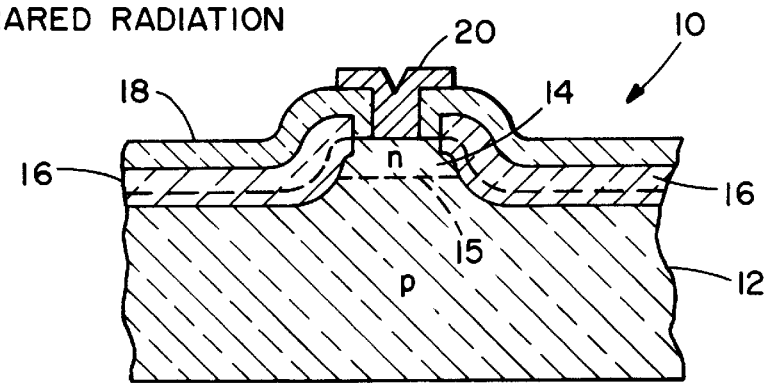
FIG. 1b is a cross-sectional view of a photodiode 10 having a HgCdTe radiation absorbing base layer 12, a HgCdTe cap layer 14 and a graded passivation layer 16.

Referring now to FIG. 1b there is shown in cross-section one of the photodiodes of array 1, specifically a double layer HgCdTe heterojunction photodiode 10 having a bottom surface for admitting infrared radiation. Photodiode 10 comprises a base layer 12 wherein the incident radiation is absorbed, thereby generating charge carriers. The radiation absorbing base layer 12 maybe either p-type or n-type semiconductor material and has a cap layer 14 which is of an opposite conductivity type for forming a p-n junction 15. Thus, if the radiation absorbing base layer 12 is p-type HgCdTe the cap layer 14 is n-type HgCdTe. Charge carriers generated by the absorption of IR radiation result in a current flow across the junction 15, this current flow being detected by a readout circuit (not shown) which is coupled to the photodiode 10.

For example, the base layer 12 may be p-type and may be doped with arsenic to a concentration of approximately $5 \times 10^{15}$ to approximately $5 \times 10^{16}$ atoms/cm$^3$. The cap layer 14 may be made n-type by doping with indium to a concentration of approximately $10^{16}$ to approximately $10^{17}$ atoms/cm$^3$.

In accordance with a preferred embodiment of the invention, the upper surfaces of the $Hg_{(1-x)}Cd_xTe$ base layer 12 and cap layer 14 are passivated by grading the chemical composition, or x-value, normal to the surface; the chemical composition being graded from that of the active detector material to a larger x-value sufficient to create a wider bandgap region and thereby generate a reflecting barrier to both electrons and holes. Such a graded passivation layer 16 advantageously functions to electrically separate the active detector material from the device surface. For example, photodetectors having a cut-off wavelength of approximately 12 microns may have an x-value of approximately 0.2 which is graded, in accordance with the invention, to an x value of approximately $0.5 \leq x \leq 1.0$ at the outer surface of the passivation layer.

In accordance with a preferred method of the invention the grading of the passivation layer 16 is accomplished by a cation substitution method whereby atoms of a Group II substance, such as Cd or Zn, are diffused under elevated temperature into the surface of an underlying Group II-VI material. The underlying material may comprise HgCdTe. The diffused atoms occupy cation sites previously occupied by Hg and/or Cd atoms. Enhanced device performance and stability are realized because the p-n diode junction 15, and an associated diode junction depletion region, are buried below the graded passivation layer 16 and are thereby electrically isolated from surface disorders and impurities which otherwise degrade diode performance.

It can be appreciated that the graded region of the passivation layer 16 forms a heterostructure with the underlying detector material. That is, the crystalline structure of the passivation layer 16 is substantially continuous with the crystalline structure of the radiation absorbing layers. This crystalline continuity advantageously provides for a continuous extension of the bandgap structure of the HgCdTe layers 12 and 14, which have typical energies of 0.1 to 0.3 eV, to the wider bandgap of the graded passivation layer 16. The HgCdTe layers 12 and 14 may have similar or dissimilar energy bandgaps which are less than that of the layer 16.

For example, CdTe has a bandgap of approximately 1.6 eV. This results in a bending of the conduction band in an upward direction thereby repelling electrons from the HgCdTe/CdTe interface. This wider bandgap further results in the valence band bending in a downwards direction, thereby repelling holes from the interface. This is shown in FIG. 2 and will be described in more detail hereinafter.

Referring once more to FIG. 1b the diode 10 may also comprise an overglass layer 18 which may be comprised of any suitable dielectric material such as $Si_3N_4$, $SiO_2$ or ZnS. The contact 20 may be comprised of any suitable material which is operable for forming an ohmic contact to the cap layer 14. Preferably, the metallic contact 20 does not diffuse significantly into the cap layer 14. Metals which are suitable for forming the contact 20 are palladium and titanium.

Figure 2:
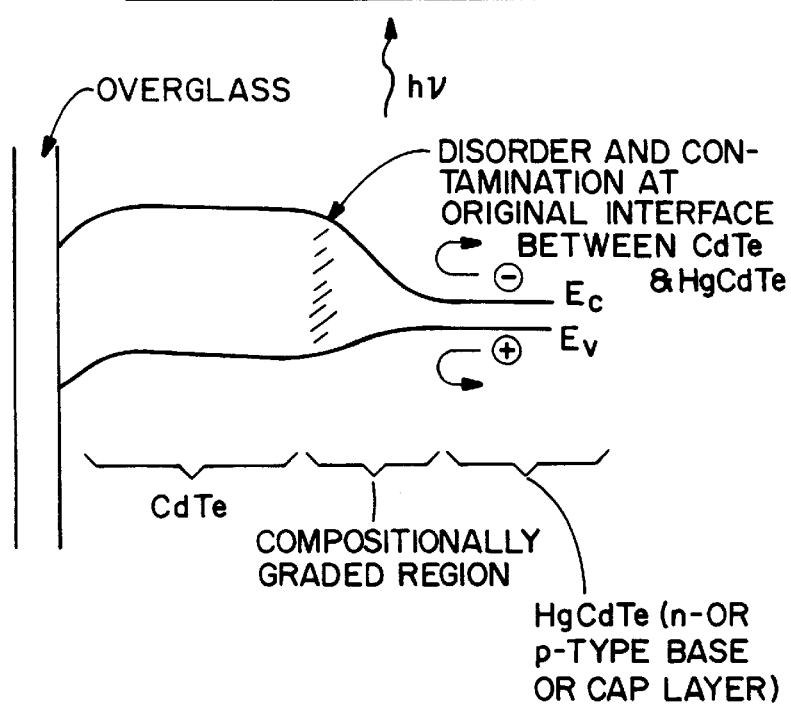
FIG. 2 is a representative energy bandgap diagram of the CdTe or CdZnTe passivated photodiode of FIG. 1b.

Referring now to FIG. 2 there is shown an idealized energy band diagram of the photodiode 10 of FIG. 1 wherein the wider bandgap passivation layer 16 is comprised of CdTe and wherein the narrower bandgap material comprises either the base HgCdTe layer 12 or the cap HgCdTe layer 14. As can be seen, there is shown a continuously varying potential energy in the conduction and valence bands such that the conduction band is bent upwards and the valence band is bent downwards. This results in the repulsion of both electrons and holes, respectively, from the HgCdTe/graded passivation interface. This repulsion of both electrons and holes from the interface, wherein the relatively high density of lattice dislocations and impurities would otherwise cause excess surface state generation currents and a reduced carrier lifetime, results in the photodiode of the invention exhibiting superior performance over conventional $SiO_2$ passivated photodiodes.

Furthermore, the upper surface of the graded passivation layer 16 may be doped to isolate charges on the, for example, CdTe surface from the underlying HgCdTe surface. In the diagram of FIG. 2 the upper surface of the CdTe passivation layer 16 has been doped with an n-type impurity. If desired, a p-type impurity may be employed instead. A typical doping concentration of the upper surface of the passivation layer 16 is approximately $10^{17}$ atoms/cm$^3$.

Referring to FIGS. 3a–3f there is illustrated one preferred method of fabricating a graded heterojunction passivation layer. Although FIGS. 3a–3f illustrate this preferred method in relation to a mesa-type of photodiode it should be appreciated that the method of the invention is equally applicable to planar-type HgCdTe photodiodes and arrays thereof.

Figure 3A:
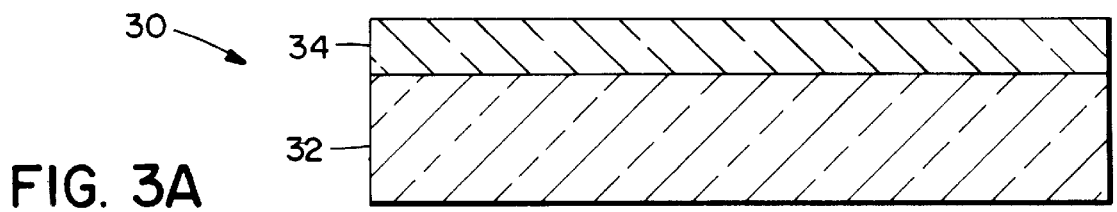
FIGS. 3a–3f show various steps of one method of the invention of fabricating a graded passivation layer upon a photodiode.

FIG. 3a shows a cross-sectional view of a double layer HgCdTe heterojunction structure 30 having a HgCdTe base layer 32 and an HgCdTe cap layer 34. Base and cap layers 32 and 34 may each be doped with a suitable impurity such that one is p-type and one is n-type semiconductor material or may be made n-type or p-type by any suitable known method.

Figure 3B:
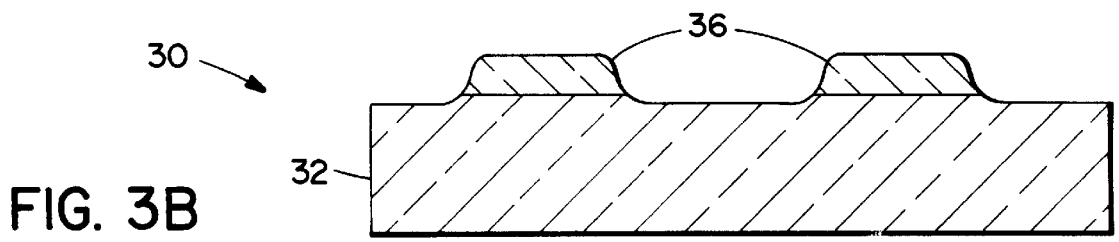
Figure 3C:
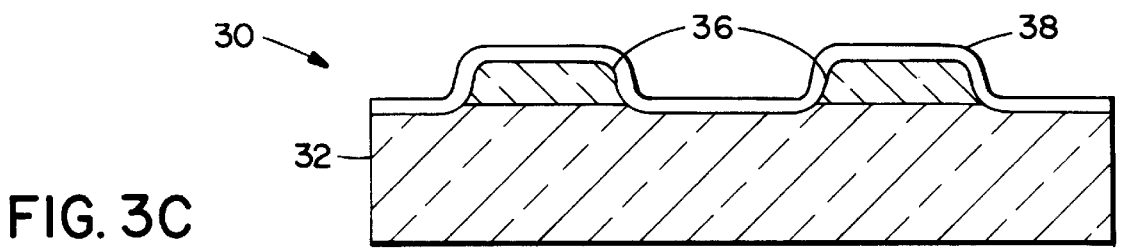
Figure 3D:
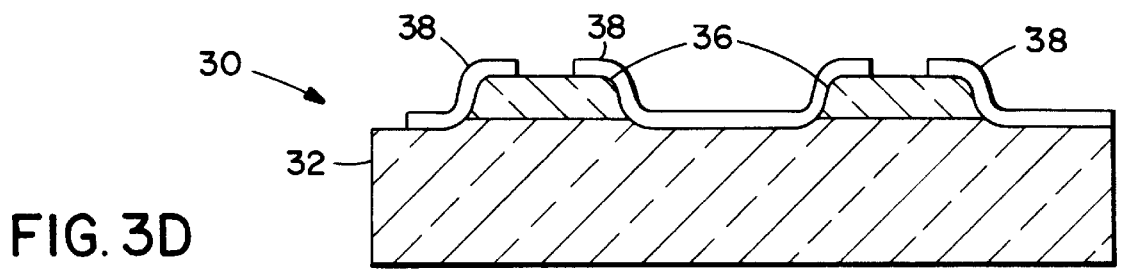

FIG. 3b shows the structure of FIG. 3a after mesas 36 have been etched to isolate individual diodes, each mesa defining a photodiode. The mesas 36 may be created by using conventional photolithography and etching techniques. Next a surface preparation step is accomplished. In accordance with one method of the invention the surface preparation step includes a surface etching process which selectively removes both Cd and Hg from exposed surface regions of the HgCdTe material, thereby depleting the surface region of Group II atoms. This surface etching process is described in more detail hereinafter. A layer of source material 38 is thereafter applied to the outer surface of the mesas 36 and exposed portions of the radiation absorbing base layer 32. This layer of source material is shown in FIG. 3c. In FIG. 3d it can be seen that portions of the source material layer 38 are thereafter removed to define regions where contact metallization will later be deposited. In accordance with one embodiment of the invention, the layer 38 of source material is comprised of CdTe which is applied by a thermal evaporation process. It should be realized however that any suitable deposition process may be utilized to deposit the layer 38. Also, the layer 38 may comprise other than CdTe. For example, the layer 38 may comprise elemental Cd, elemental Zn, a zinc alloy such as ZnTe, HgCdTe or HgZnTe which has a wider energy bandgap than the underlying material or any suitable Group II material having a valence of +2.

Figure 3E:
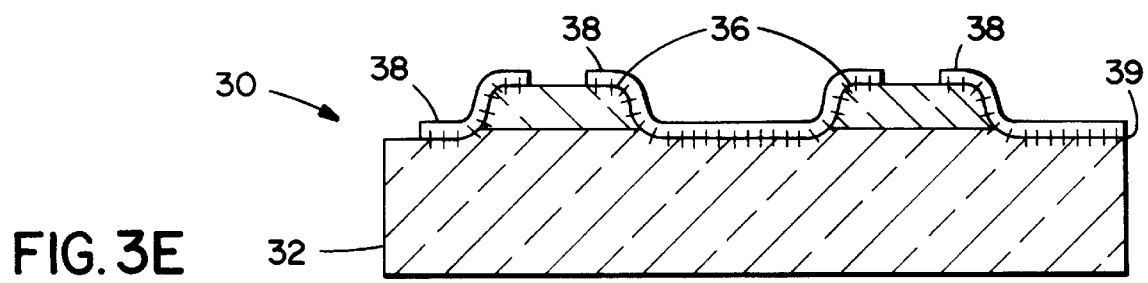

FIG. 3e shows the photodiode structure 30 after a heating process which causes the Cd to diffuse from the layer 38 of source material into the $Hg_{(1-x)}Cd_xTe$ base and cap layers 32 and 34, respectively. This heating process also results in a corresponding diffusion of Hg in an opposite direction. This inward diffusion of Cd causes the composition, or x-value, to be graded from approximately x=1.0 at the outer surface of layer 38 to that of the value of x of the HgCdTe which comprises the base or cap layers 32 and 34. This diffused layer, or graded region, is shown diagramatically in FIG. 3e as a plurality of surface normals 39.

Figure 3F:
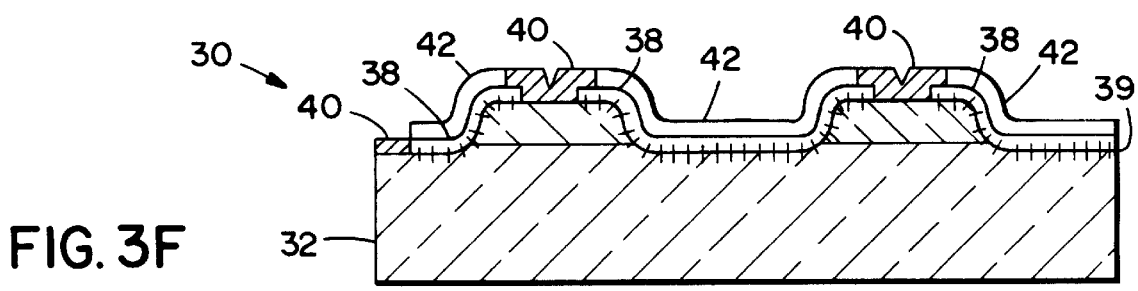

In FIG. 3f there is shown a completed portion of the photodiode array after the application of contact metalization 40 to the individual photodiodes. FIG. 3f also shows the optional layer of overglass 42.

Referring to FIGS. 4a–4d there is illustated a surface region which is depleted of Hg and Cd and also the inward diffusion of Cd or Zn during a cation substitution process. The mechanism which accomplishes the compositional grading of the surface region is related to the diffusion of Cd atoms from the source layer 36 into the underlying HgCdTe surface wherein the Cd atoms occupy near-surface cation sites previously occupied by Hg and Cd atoms. This cation substitution process occurs at elevated temperatures due to the thermal instability of the Hg—Te bond. Once the Hg—Te bond is broken by thermal activation, an inwardly diffusing Cd atom may bond with the Te atom. As an increasing number of cation sites become occupied with Cd atoms, the x value of the HgCdTe base and cap layer surfaces is increased. The resulting grading profile is thus a direct function of the Cd diffusion profile. As a result, the energy bandgap of the graded region is increased while also improving the chemical and thermal stability of this region.

Figure 4A:
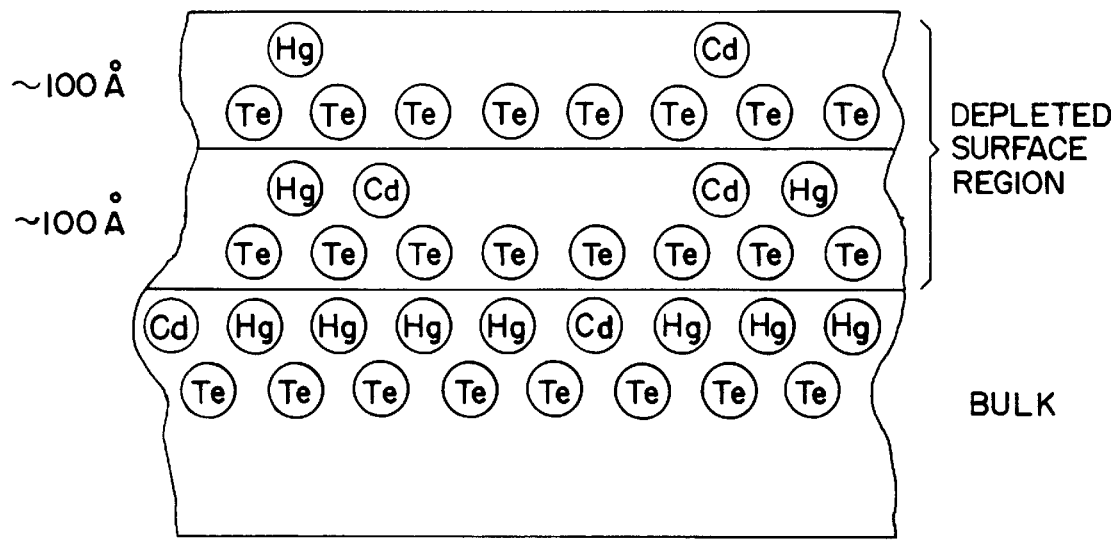
Figure 4B:
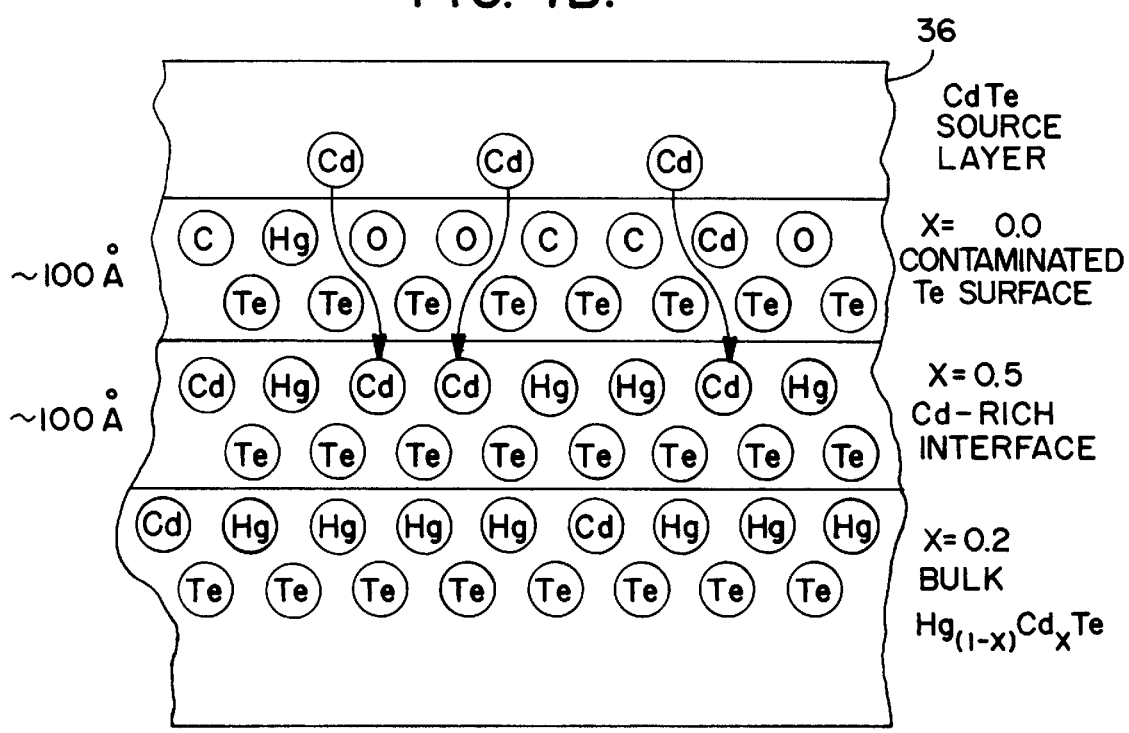

The Hg and Cd atoms may be removed from the upper surface region during the aforementioned surface etching process which may employ a solution of bromine and ethylene glycol, the bromine concentration typically being 0.25% by volume. The etchant solution may be left in contact with the surface for approximately one to two minutes. As can be seen in FIG. 4a the surface region of the HgCdTe bulk is thereby depleted of both Hg and Cd, the amount of depletion being a function of depth into the bulk material. As can be seen in FIG. 4b, the source layer 36 has been applied over the depleted upper surface region. The outer portion of the upper surface typically becomes contaminated by an oxide and/or hydrocarbon layer. This contaminated layer may have a depth of approximately 100 angstroms. Beneath this contaminated surface layer is the depleted layer wherein there are availaible a number of cation vacancy sites which, in accordance with the invention, are filled by, for example, Cd atoms which diffuse inward from the source layer 36 during an annealling process. During this anneal some Hg atoms diffusing outwards from the bulk material may also enter the Cd-rich layer. However, due to the substantial difference between the binding energies of the Cd—Te and Hg—Te bonds, these Hg atoms do not bind or do not remain bound with the Te because of the elevated temperature employed during the anneal. Thus, these Hg atoms do not contribute significantly to the composition of this layer which, as a result, is enriched by Cd. This Cd enriched layer, as has been stated, is compositionally graded as a function of depth and also has a wider energy bandgap than the underlying HgCdTe bulk material. The Cd enriched layer may have a depth of from approximately several hundred angstoms to several thousand angstroms; 5000 angstroms being a typical value depending on the surface preparation process and the anneal time and temperature. It should be appreciated that the inwardly diffusing Cd atoms fill cation vacancies created by the surface preparation process, within a region approximately 100 angstroms thick, and also diffuse inward to much greater depths. These Cd atoms replace Hg atoms to create a compositionally graded region several thousand angstroms thick. As such, approximately 1000 molecular layers of HgCdTe may exist within the enriched region, the layers closer to the surface being richer in Cd than those layers closer to the bulk material due in part to the depletion profile created during the surface etching process. Thus, this enriched layer is compositionally graded such that the value of x is highest at the upper surface of the enriched layer and gradually approaches the value of x of the underlying bulk material.

The preparation of the upper surface region may or may not cause depletion of Group II atoms. In one embodiment of the invention the surface is prepared so that it is stoichiometric (i.e. there is no depletion of Cd or Hg). This stoichiometric surface region is then annealed such that Hg atoms which are freed from the structure due to thermal effects are replaced by Cd atoms. This surface preparation and subsequent annealing thereby causes the bandgap at the outer surface to be widened by cation substitution. This substitution occurs as follows. At 400° C. (in a saturated Hg atmosphere) the thermal energy is sufficient to break the Hg—Te bonds thereby freeing Hg atoms in the HgCdTe crystal lattice. Subsequently, Cd atoms, which are diffusing into the HgCdTe from the overlying Cd source material, combine with the Te atoms to form the more thermally stable Cd—Te bonds.

FIG. 4c shows analogous structure for the ternary compound $Hg_{(1-x)}Zn_xTe$ wherein Zn is diffused inwards from the source layer 36 to occupy cation vacancy sites made available by the aforementioned surface etch and diffusion processes.

As can be appreciated, the wider bandgap Cd-rich layer also serves to isolate the underlying HgCdTe material from the contaminated surface layer, thereby beneficially reducing surface recombination and leakage current effects. That is, charge carriers within the underlying HgCdTe are repelled away from the contaminated surface by the wider bandgap Cd-rich layer. Thus, the method of the invention may be advantageously employed during the fabrication of various types of photodetecting devices, other types of bipolar junction devices, charge coupled devices (CCDs) and also metal-insulator-semiconductor (MIS) type devices, such as MIS capacitors. The invention may also be advantageously employed for the fabrication of IR radiation responsive photoconductors.

As shown in FIG. 4d the method of the invention may be used to create a wider bandgap, graded passivation layer which has a quaternary composition. That is, the underlying bulk material may be comprised of HgCdTe while the source layer 36 may be comprised of Zn or ZnTe. The resulting composition of the passivation layer is thus the quaternary alloy HgCdZnTe. Alternatively, the bulk material may comprise HgZnTe and the source layer may comprise Cd.

In accordance with one preferred method of the invention, the structure 30 of FIG. 3 is first annealled at approximately 400° C. for approximately four hours in a saturated Hg vapor atmosphere to accomplish the desired grading profile. This first anneal is followed by a second anneal at approximately 250° C. for approximately four hours to reestablish a stoichiometric amount of Hg in the bulk absorbing region. These steps of annealing are typically carried out in an ampoule having a partial pressure of Hg.

Figure 5:
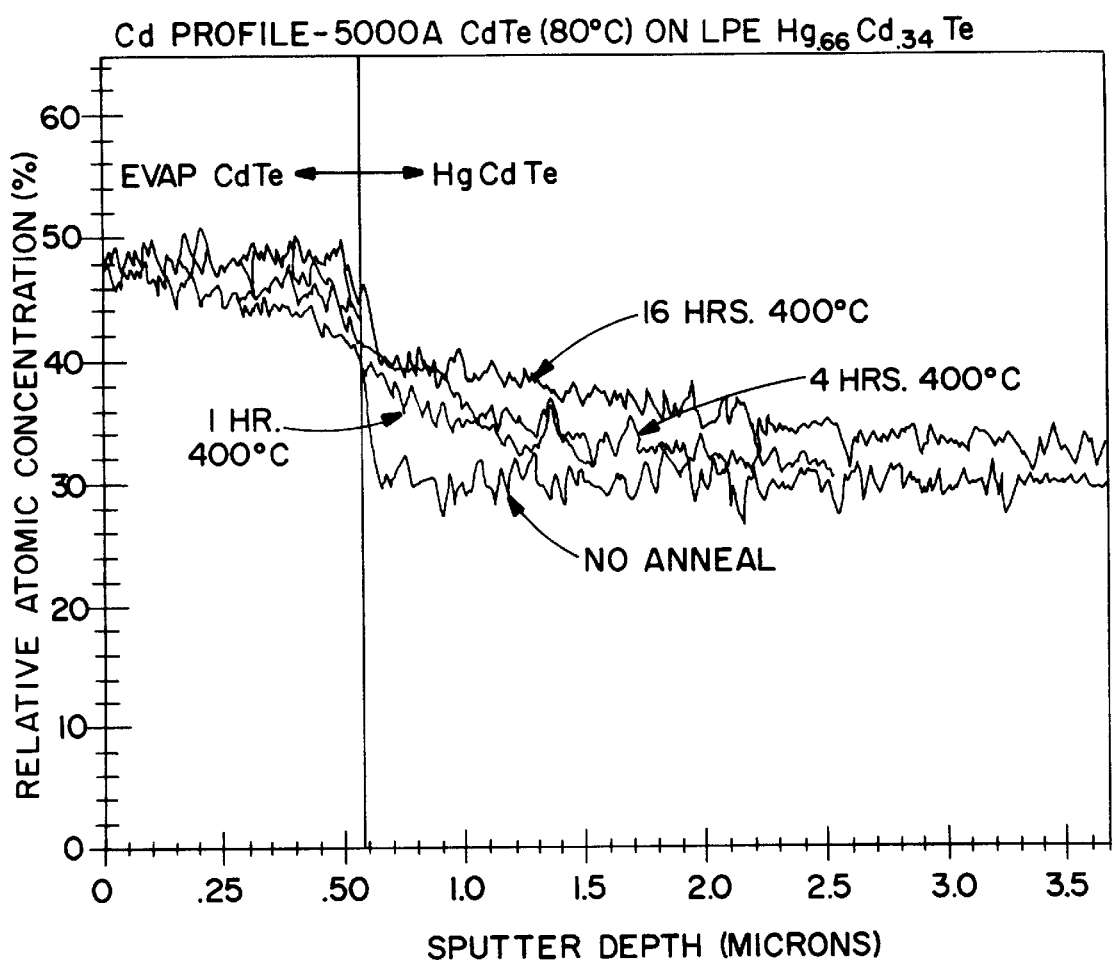
FIG. 5 is a graph showing Cd concentration versus depth as a function of annealing time at 400° C. in saturated Hg vapor.

In FIG. 5 there is shown the experimentally measured Cd concentration versus depth as a function of anneal time at 400° C. in a saturated Hg vapor. As can be seen, the Cd concentration varies in a manner normal to the surface and has a gradually decreasing concentration.

Figure 6A:
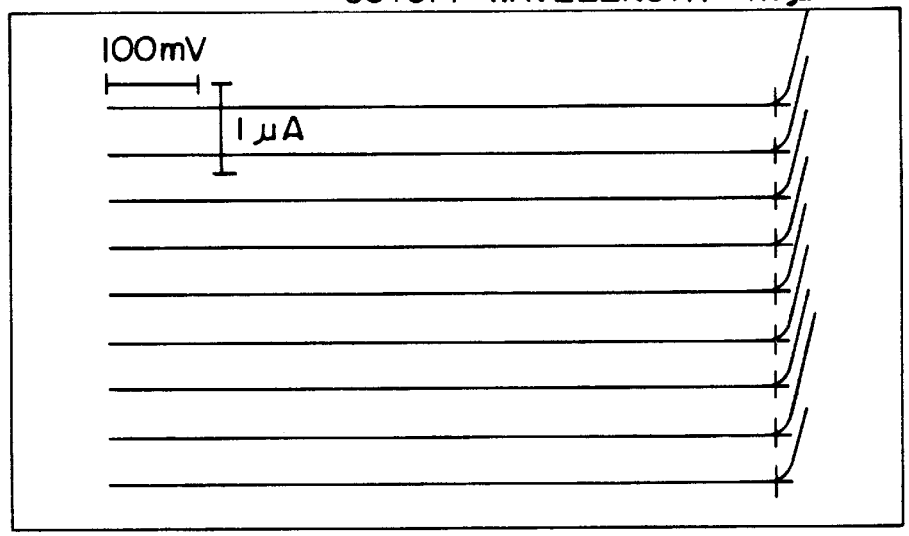
FIGS. 6a and 6b show a comparison of I-V curves for a diode passivated in accordance with the invention and for a conventional $SiO_2$ passivated LWIR photodiode, respectively.
Figure 6B:
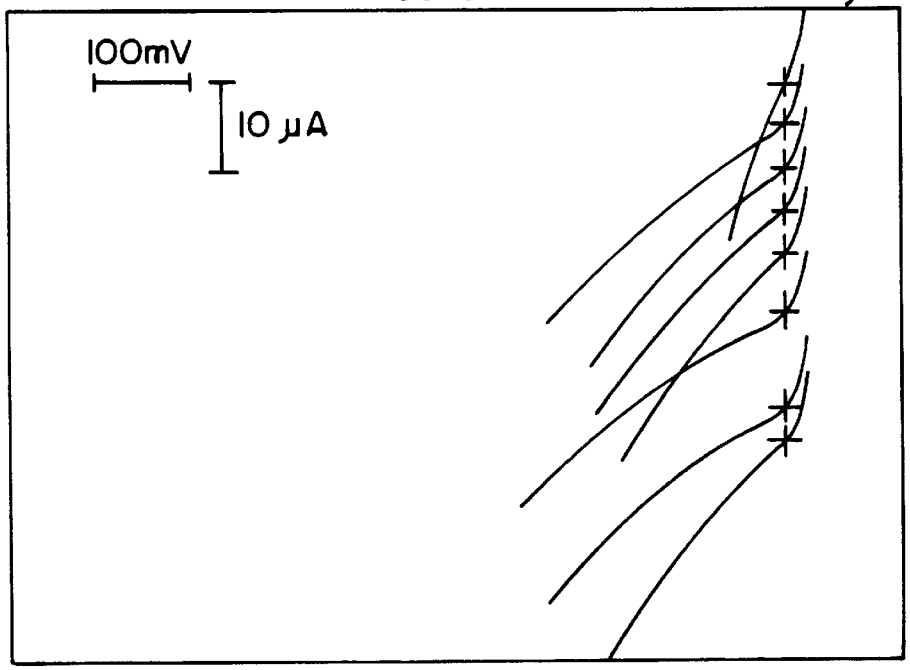

In FIGS. 6a and 6b there is shown a comparison of I-V curves for diodes passivated in accordance with the invention and for conventional $SiO_2$ passivated LWIR photodiodes, respectively, both being fabricated from the same wafer of HgCdTe.

Figure 7A:
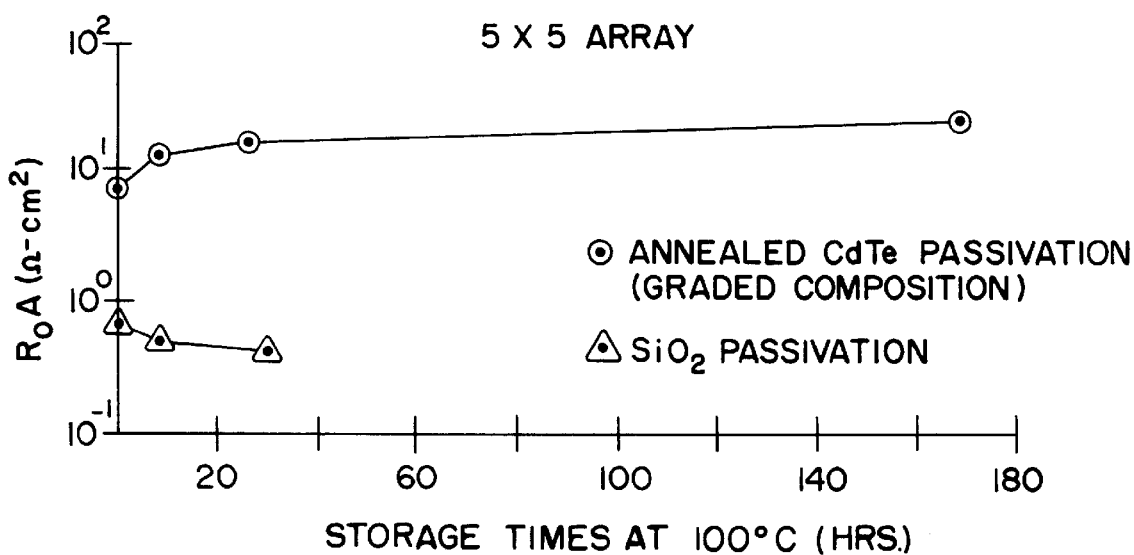
FIGS. 7a and 7b show a comparison of $R_oA$ as a function of storage time at 100° C. for a graded layer CdTe and conventional $SiO_2$ LWIR 5×5 array and isolated variable area diodes, respectively.
Figure 7B:
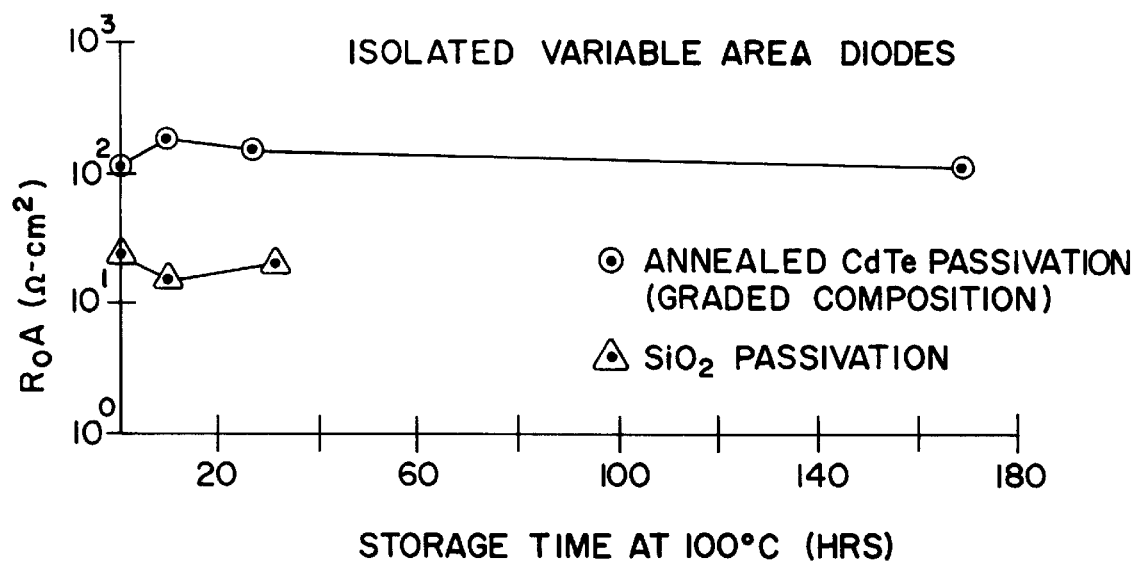

FIGS. 7a and 7b show a comparison of $R_oA$ as a function of storage time at 100° C. for a graded layer CdTe and conventional $SiO_2$ passivated LWIR 5×5 array and isolated variable area diodes, respectively.

In both FIGS. 6 and 7 it can readily be seen that IR photodiodes constructed in accordance with the invention have superior performance characteristics as compared to photodiodes constructed in accordance with a conventional $SiO_2$ passivation layer.

As has been previously stated, presently preferred embodiments of the invention have herein been described. It is possible that those skilled in the art may derive modifications to these presently preferred embodiments based upon the foregoing disclosure. For example, although the presently preferred embodiments of the invention have been disclosed in the context of a mesa-type array of photodiodes it should be realized that the teachings of the invention also apply to planar-types of photodiodes and, in general, to any devices, such as photoconductors, CCDs, or MIS devices comprised of Group II-VI material. Thus, it should be understood that the invention is not to be limited to only the presently preferred embodiments disclosed above but is instead intended to be limited only as defined by the appended claims.

What is claimed is:

1. A method of forming a passivation region upon a semiconductor device comprising the steps of:
   providing a body comprised of Group II-VI material having a characteristic bandgap energy or energies;
   preparing a surface region of the body;
   selecting a second material comprised of Group II atoms and forming a layer of said second material overlying the prepared surface of the body; and
   forming a passivation region within the prepared surface region wherein the Group II atoms occupy cation sites in gradually decreasing concentration as a function of depth into the surface region; wherein the step of selecting said second material is accomplished by selecting a second material so that the passivation region has a crystalline structure that is substantially continuous with the crystalline structure of the Group II-VI material underlying said passivation layer.

2. A method as defined in claim 1 wherein the step of providing a body of Group II-VI material is accomplished by providing a body of $Hg_{(1-x)}Cd_xTe$, $Hg_{(1-x)}Zn_xTe$ or HgCdZnTe.

3. A method as defined in claim 1 wherein the step of selecting a second material is accomplished by selecting Cd, Zn, CdTe, ZnTe, or HgCdTe or HgZnTe having a wider bandgap energy than the characteristic bandgap energy or energies of the body.

4. A method as defined in claim 3 and further comprising a step of doping an upper surface of the passivation region.

5. A method as defined in claim 1 wherein the step of forming a passivation region includes a step of annealing the body at a predetermined temperature for a predetermined interval of time.

6. A method as defined in claim 5 wherein the step of annealing is accomplished at approximately 400° C. for approximately four hours in a saturated Hg vapor atmosphere.

7. A method as defined in claim 6 wherein the step of annealing includes a further step of annealing at approximately 250° C. for approximately four hours.

8. A method as defined in claim 1 and further comprising a step of forming a layer comprised of a dielectric material over a surface of the passivation region.

9. A method of forming a passivation region upon a semiconductor device comprising the steps of:
   providing a body comprised of Group II-VI material having a characteristic bandgap energy or energies;
   depleting an upper surface region of the body of Group II atoms to form cation vacancies therein;
   selecting a second material comprised of Group II atoms and forming a layer of said second material overlying the depleted region; and
   forming a passivation region at least within the upper surface region of the body wherein the Group II atoms occupy the cation vacancies in gradually decreasing concentration as a function of depth into the region; wherein the step of selecting said second material is accomplished by selecting a second material so that the passivation region has a crystalline structure that is substantially continuous with the crystalline structure of the Group II-VI material underlying said passivation layer.

10. A method as defined in claim 9 wherein the step of providing a body of Group II-VI material is accomplished by providing a body of $Hg_{(1-x)}Cd_xTe$, $Hg_{(1-x)}Zn_xTe$ or HgCdZnTe.

11. A method as defined in claim 9 wherein the step of selecting a second material is accomplished by selecting Cd, Zn, CdTe, ZnTe, or HgCdTe or HgZnTe having a wider bandgap energy than the characteristic bandgap energy or energies of the body.

12. A method as defined in claim 9 and further comprising a step of doping an upper surface of the passivation region.

13. A method as defined in claim 9 wherein the step of forming a passivation region includes a step of annealing the body at a predetermined temperature for a predetermined interval of time.

14. A method as defined in claim 13 wherein the step of annealing is accomplished at approximately 400° C. for approximately four hours in a saturated Hg vapor atmosphere.

15. A method as defined in claim 14 wherein the step of annealing includes a further step of annealing at approximately 250° C. for approximately four hours.

16. A method as defined in claim 9 and further comprising a step of forming a layer comprised of a dielectric material over a surface of the passivation region.

17. A method as defined in claim 9 wherein the step of depleting is accomplished by etching a surface of the body.

18. A method as defined in claim 17 wherein the surface is etched with a bromine solution.

19. A method of fabricating an array of IR photodiodes comprising the steps of:

provifing an infrared radiation absorbing base layer and a plurality of regions in contact with the base layer, the base layer and each of the regions being comprised of Group II-VI material and having an opposite type of electrical conductivity one from the other for defining at an interface therebetween a plurality of p-n diode junctions, the base layer having a first characteristic energy bandgap and the regions having a second characteristic energy bandgap;

preparing an upper surface region of at least each of the p-n diode junctions;

selecting a second material comprised of Group II atoms and depositing it over the prepared surface regions; and annealing the deposited layer and underlying Group II-VI material at a first predetermined temperature for a first predetermined interval of time such that Group II atoms of the deposited layer diffuse into the underlying prepared surface regions and react with Group VI atoms, said second material being selected so that the crystalline structure between the Group II-VI material and the second material is substantially continuous after the annealing;

whereby a passivation region having a wider energy bandgap than the underlying Group II-VI material is formed.

20. A method as defined in claim 19 wherein the radiation absorbing layer and the regions are comprised of HgCdTe and wherein the passivation region comprises a region enriched with cadmium atoms having a gradually decreasing concentration profile as a function of depth into the surface of each of the p-n diode junctions.

21. A method as defined in claim 19 wherein the radiation absorbing layer and the regions are comprised of HgCdTe and wherein the passivation region comprises a region enriched with zinc atoms having a gradually decreasing concentration profile as a function of depth into the surface of each of the p-n diode junctions.

22. A method as defined in claim 19 wherein the radiation absorbing layer and each of the regions are comprised of HgZnTe and wherein the passivation region comprises a region enriched with cadmium atoms having a gradually decreasing concentration profile as a function of depth into the surface of each of the p-n diode junctions.

23. A method as defined in claim 19 wherein the radiation absorbing layer and each of the regions are comprised of HgZnTe and wherein the passivation region comprises a region enriched with zinc atoms having a gradually decreasing concentration profile as a function of depth into the surface of each of the p-n diode junctions.

24. A method as defined in claim 19 wherein the radiation absorbing base layer and each of the regions are comprised of $Hg_{(1-x)}Cd_xTe$ and wherein the deposited layer is comprised of Cd.

25. A method as defined in claim 24 wherein the passivation region is a graded region comprised of $Hg_{(1-x)}Cd_xTe$ having a value of x equal to approximately 0.5 to approximately 1.0 at an upper surface thereof, the value of x being graded normal to the surface such that the value of x at a predetermined depth is approximately equal to the value of x of the underlying base layer and regions.

26. A method as defined in claim 19 wherein the radiation absorbing base layer and each of the regions are comprised of $Hg_{(1-x)}Zn_xTe$ and wherein the deposited layer is comprised of Zn.

27. A method as defined in claim 26 wherein the passivation region is a graded region comprised of $Hg_{(1-x)}Zn_xTe$ having a value of x equal to approximately 0.5 to approximately 1.0 at an upper surface thereof, the value of x being graded normal to the surface such that the value of x at a predetermined depth is approximately equal to the value of x of the underlying base layer and regions.

28. A method as defined in claim 19 wherein the step of annealing is accomplished at a temperature of approximately 400° C. for approximately four hours in an ampoule containing a partial pressure of Hg.

29. A method as defined in claim 28 wherein the step of annealing comprises an additional step of annealing at a temperature of approximately 250° C. for approximately four hours in an ampoule containing a partial pressure of Hg.

30. A method as defined in claim 19 and further comprising the step of doping an upper surface of the passivation region.

31. A method as defined in claim 19 wherein the step of preparing is accomplished by etching the surface.

32. A method as defined in claim 31 wherein the surface is etched with a bromine solution.

33. A method as defined in claim 19 wherein the radiation absorbing base layer and each of the regions are comprised of HgCdZnTe and wherein the deposited layer is comprised of Zn.

34. A method as defined in claim 19 wherein the radiation absorbing base layer and each of the regions are comprised of HgCdZnTe and wherein the deposited layer is comprised of Cd.

35. A method of passivating a surface of a body comprised of Group II-VI material, comprising the steps of:

providing the body of Group II-VI material;

depleting a surface region to be passivated of Group II atoms to create cation vacancy sites therein;

selecting a second material comprised of Group II atoms and depositing it over the depleted surface region; and annealing the body and the layer at a given temperature for a given period of time such that the Group II atoms within the layer diffuse into the depleted surface region and substitute into the cation vacancy sites therein, said second material being selected so that the crystalline structure between the layer and the depleted surface region is substantially continuous after said annealing, whereby an energy bandgap of the surface region is increased and the surface is passivated.

36. The method of claim 35 wherein the step of depleting creates cation vacancy sites in gradually decreasing numbers as a function of depth from the surface.

37. The method of claim 36 wherein the passivated surface comprises Group II atoms in gradually decreasing concentration as a function of depth from the surface.

38. The method of claim 36 wherein the step of depleting is accomplished by etching the surface with a bromine solution.

39. The method of claim 35 and further comprising a step of doping the passivated surface.

40. The method of claim 35 wherein the step of providing a body of Group II-VI material is accomplished by providing an array of IR radiation responsive photodiodes.

41. The method of claim 35 wherein the step of providing a body of Group II-VI material is accomplished by providing an array of IR radiation responsive photoconductors.

42. A method of passivating a surface of a body comprised of Group II-VI material, comprising the steps of:
   providing a body of Group II-VI material of substantially stoichiometric composition;
   depositing a layer of a second material comprised of Group II atoms over a surface of the body, the second material being selected so that the crystalline structure of the Group II-VI material and the second material is continuous after annealing; and
   annealing the body and the layer such that Group II atoms from the layer occupy cation vacancy sites within the body, wherein
   the cation vacancy sites are created at least by thermal effects caused by the step of annealing.

43. The method of claim 42 wherein the step of annealing creates cation vacancy sites in gradually decreasing numbers as a function of depth from the surface.

44. The method of claim 42 and further comprising a step of doping the passivated surface.

* * * * *